(12) United States Patent
Ohashi

(10) Patent No.: US 7,670,954 B2
(45) Date of Patent: Mar. 2, 2010

(54) METHOD OF MANUFACTURING SEMICONDUCTOR DEVICE

(75) Inventor: Takuo Ohashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 6 days.

(21) Appl. No.: 11/943,984

(22) Filed: Nov. 21, 2007

(65) Prior Publication Data

US 2008/0124892 A1      May 29, 2008

(30) Foreign Application Priority Data

Nov. 28, 2006   (JP)  ............................. 2006-319728

(51) Int. Cl.
*H01L 21/461*   (2006.01)
(52) U.S. Cl. .................. 438/700; 438/297; 438/475; 438/773; 257/E21.229; 257/E21.304; 257/E21.068; 257/E21.231; 257/E21.278; 257/E21.293
(58) Field of Classification Search ................. 438/297, 438/294, 474, 475, 553, 692, 700, 753, 773
See application file for complete search history.

(56) References Cited

U.S. PATENT DOCUMENTS

| 4,531,282 | A | * | 7/1985 | Sakai et al. | ................. 438/365 |
| 4,545,114 | A | * | 10/1985 | Ito et al. | ..................... 438/301 |
| 4,555,842 | A | * | 12/1985 | Levinstein et al. | .......... 438/232 |
| 4,583,106 | A | * | 4/1986 | Anantha et al. | ............. 257/559 |
| 4,722,908 | A | * | 2/1988 | Burton | ....................... 438/368 |
| 2007/0218624 | A1 | * | 9/2007 | Satake et al. | ............... 438/240 |

FOREIGN PATENT DOCUMENTS

| JP | 8-107205 A | 4/1996 |
| JP | 2004-186359 A | 7/2004 |
| JP | 2004-311487 A | 11/2004 |
| JP | 2004-363121 A | 12/2004 |

* cited by examiner

*Primary Examiner*—David Nhu
(74) *Attorney, Agent, or Firm*—Sughrue Mion, PLLC

(57) ABSTRACT

Provided is a method of manufacturing a semiconductor device including at least two processes. Under an atmosphere comprising hydrogen and oxygen, a sacrificial oxide film is formed on a silicon substrate that is provided with at least one nitride region. Then, the sacrificial oxide film and the nitride region are removed from the silicon substrate.

13 Claims, 5 Drawing Sheets

METHOD OF MANUFACTURING SEMICONDUCTOR DEVICE

This Application claims priority from Japanese Application 2006-319728, filed on Nov. 26, 2006.

BACKGROUND OF THE INVENTION

This invention relates to a method of manufacturing a semiconductor device and, in particular, to a manufacturing method for removing undesirable nitride regions by using a sacrificial oxide film.

In the process of manufacturing semiconductor devices such as field effect transistors, the semiconductor devices on the silicon substrate are separated by a field insulation film or an STI (Shallow Trench Isolation) film.

JP H8-107205A discloses a technique for separating the semiconductor devices by the field oxide film which is formed by the LOCOS (Local Oxidation of Silicon) method. During the field oxidation process, nitride films are also oxidized so that nitrogen atoms (N) or ammonium molecules ($NH_3$) are produced and form undesirable nitride regions in field regions. In order to remove the undesirable nitride regions, a sacrificial oxide film is formed on the silicon substrate. Then, the silicon substrate is soaked in hydrofluoric acid solution to remove the undesirable nitride regions together with the sacrificial oxide film.

According to JP H8-107205A, the sacrificial oxide film is formed in the atmosphere comprising ozone. However, the temperature of the atmosphere should be lower than 800° C. because the thermal-resistivity of ozone is very poor.

The semiconductor devices on the silicon substrate may be separated by the STI film. During the process of forming the STI film, undesirable nitride regions are also formed on the silicon substrate. One of existing methods of removing the nitride region is to carry out dry or wet oxidation. However, during the dry or wet oxidation, the oxidizing species may diffuse into the STI film and oxidize the silicon substrate in the trench.

The oxidized STI film will expand and apply stresses to the device formation regions adjacent thereto. Such stresses may result in the increase of the junction leakage current.

SUMMARY OF THE INVENTION

According to one aspect of the present invention, a method of manufacturing a semiconductor device comprises at least two processes. Under an atmosphere comprising hydrogen and oxygen, a sacrificial oxide film is formed on a silicon substrate that is provided with at least one nitride region. Then, the sacrificial oxide film and the nitride region are removed from the silicon substrate.

An appreciation of the objectives of the present invention and a more complete understanding of its structure may be had by studying the following description of the preferred embodiment and by referring to the accompanying drawings.

Figure 1:
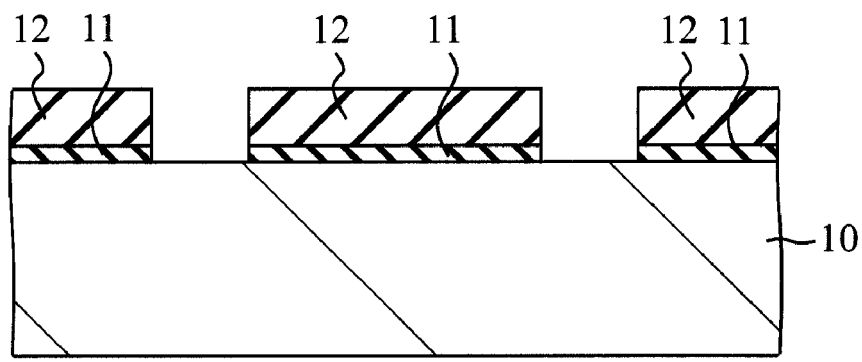
FIG. 1 is a cross-sectional view showing a process of a method of fabricating a semiconductor device in accordance with an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Referring to FIG. 1, a pad oxide film 11 made of $SiO_2$ is formed on the main surface of a silicon substrate 10, and a nitride film 12 made of $Si_3N_4$ is formed on the pad oxide film 11. In this embodiment, the thickness of the pad oxide film 11 and the nitride film 12 are 9 nm and 150 nm, respectively. Next, using a resist film (not shown) as a mask, the pad oxide film 11 and the nitride film 12 are patterned so as to expose a predetermined region of the silicon substrate 10. The resist film is removed after the patterning.

Figure 2:
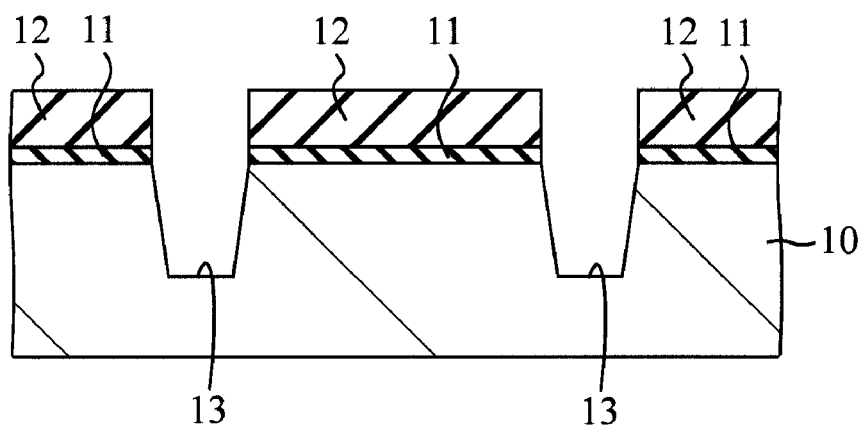
FIG. 2 is a cross-sectional view showing a subsequent process to that of FIG. 1.

Referring to FIG. 2, using the patterned nitride film 12 as a mask, the predetermined region is etched to form a trench 13. In this embodiment, a depth of the trench is 250 nm.

Figure 3:
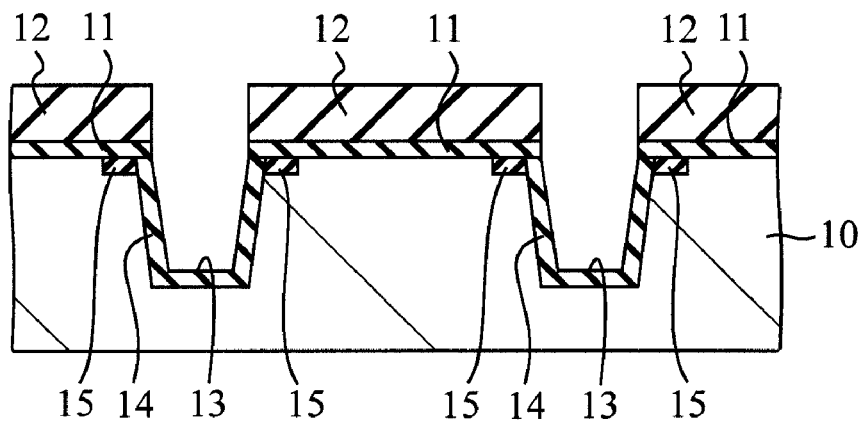
FIG. 3 is a cross-sectional view showing a subsequent process to that of FIG. 2.

Referring to FIG. 3, the trench 13 is subjected to the wet oxidation process to form a liner oxide film 14 on the surface of the trench 13. In this embodiment, the liner oxide film 14 has a thickness of 15 nm. During the wet oxidation process, the patterned nitride film 12 is also oxidized so that nitrogen atoms are moved out of the nitride film. The nitrogen atoms react with $H_2O$ molecules, which serve as oxidizing species, to form $NH_3$ molecules. The $NH_3$ molecules are diffused into the pad oxide film 11 and azotize the silicon substrate 10 so that undesirable nitride regions 15 are formed in the silicon substrate 10, wherein the undesirable nitride regions ($Si_3N_4$) 15 are positioned around the trench 13 and directly under the patterned pad oxide film 11.

Figure 4:
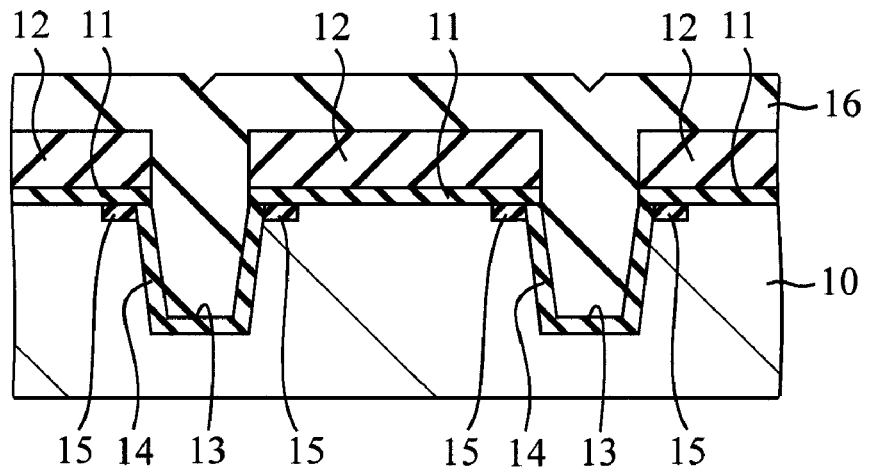
FIG. 4 is a cross-sectional view showing a subsequent process to that of FIG. 3.

Referring to FIG. 4, a high density plasma (HDP) oxide film 16 is formed to fill the trench 13.

Figure 5:
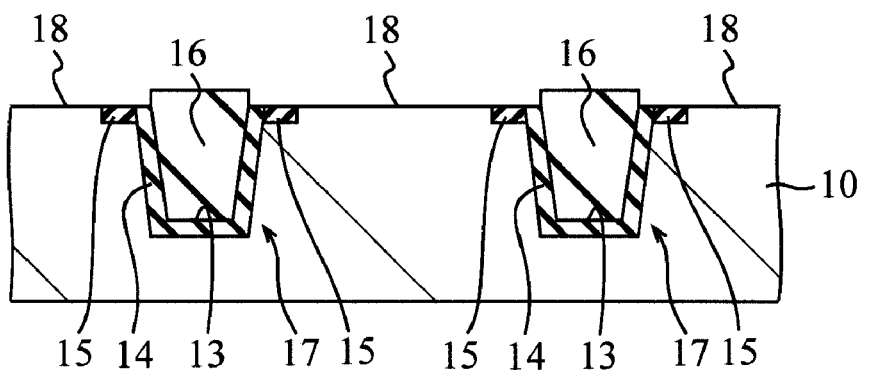
FIG. 5 is a cross-sectional view showing a subsequent process to that of FIG. 4.

Referring to FIG. 5, the HDP oxide film 16 is polished and removed by the CMP (Chemical Mechanical Polishing) method using the patterned nitride film 12 as the stopper. By removing the patterned nitride film 12 and the patterned pad oxide film 11, an STI film 17 is obtained, wherein the STI film 17 is comprised of the liner oxide film 14 and the DHP oxide film 16.

The STI film 17 defines a plurality of device formation regions 18 into the silicon substrate 10. The undesirable nitride regions 15 are exposed on the edges of the device formation regions 18. If gate oxide films are formed without removing the undesirable nitride regions 15, the undesirable nitride regions 15 inhibit the formation of the gate oxide films. As the result, the gate oxide films have thinner regions on the undesirable nitride regions 15, respectively; the thinner regions of the gate oxide films cause withstand voltage failures of the gate oxide films.

Figure 6:
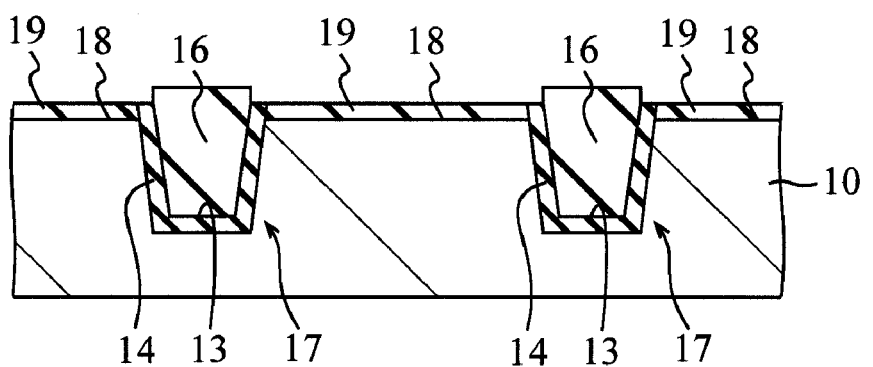
FIG. 6 is a cross-sectional view showing a subsequent process to that of FIG. 5.

Referring to FIG. 6, sacrificial oxide layers 19 are formed on the device formation region 18 in order to remove the undesirable nitride regions 15. In this embodiment, the thickness of each of the sacrificial oxide layers 19 is 9 nm. The sacrificial oxide layers 19 are formed by placing the silicon substrate 10 comprising the STI film 17 within a reaction chamber, followed by supplying a hydrogen gas ($H_2$) and an oxygen gas ($O_2$) into the reaction chamber simultaneously. In this embodiment, the ratio of $H_2$ and $O_2$ is 5:95. The atmosphere within the reaction chamber is kept at 1000° C. and 7 Torr during the formation process of the sacrificial oxide layers 19. Preferably, the temperature of the atmosphere within the reaction chamber is 800° C. or higher and, more preferably, 1000° C.

$H_2$ and $O_2$ react with each other in the reaction chamber to form water. During this process, $H_2$ and $O_2$ generate radical species which contain oxygen (O) atomic radicals and hydroxyl (OH—) molecular radicals. In comparison with the conventional wet or dry oxidation, the radical species according to this embodiment need a shortened time to oxidize exposed regions of the silicon substrate 10, i.e., the device formation regions 18 with no oxide film. In addition, the radical species will lose their energy at the thick oxide region such as the STI film 17 and turn into the oxide species which have the oxidation characteristic same as that of the oxide species generated by wet or dry oxidization. In other words, according to the present embodiment, only the surfaces of the device formation regions 18 can be oxidized without further oxidizing the inner surface of the trench 13 in the silicon substrate 10.

The thickness of the sacrificial oxide film 19 may be adjusted so that it is proportional to the thickness of the liner oxide film 14, in order to ensure complete removal of the undesirable nitride regions 15. Specifically, it is preferable that the thickness of the sacrificial oxide film 19 is 6 nm, 9 nm, and 12 nm when the thickness of the liner oxide film 14 is 10 nm, 15 nm, and 20 nm, respectively. It is more preferable that the thickness of the sacrificial oxide film 19 is three-fifth of the thickness of the liner oxide film 14.

Figure 7:
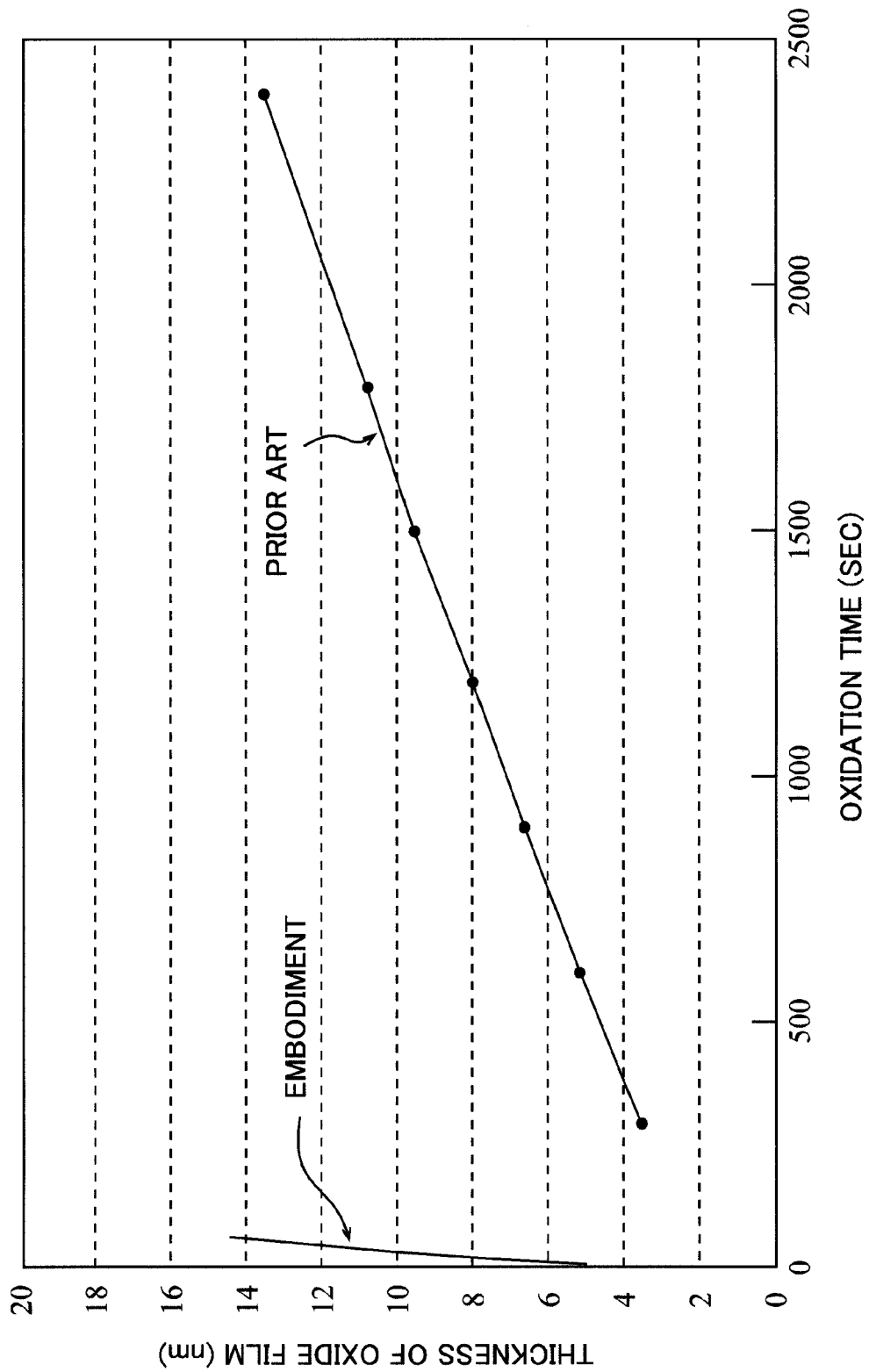
FIG. 7 is a graph showing a relationship between oxidation time of a sacrificial oxide film and a thickness of the oxide film.
Figure 11:
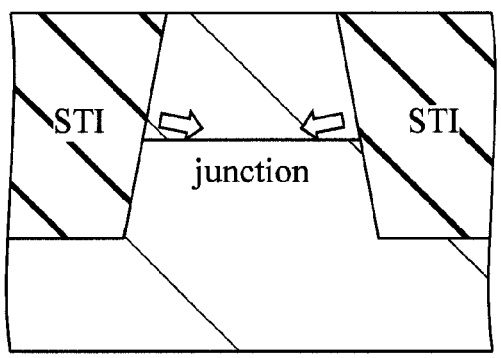
FIG. 11 is a cross-sectional view for used in describing a problem of the conventional semiconductor device.

As understood from FIG. 7, the required time for the formation of the sacrificial oxide film 19 having a thickness of 6 nm, 9 nm, or 12 nm is about 19 seconds, 47 seconds, or 86 seconds. In the earlier technique of wet or dry oxidation, the required time for the formation of the sacrificial oxide film 19 having a thickness of 6 nm, 9 nm, or 12 nm is about 800 seconds, 1500 seconds, or 2100 seconds. In other words, the time required for the formation of the sacrificial oxide film 19 in accordance with the present embodiment becomes one-twentieth of the conventional oxidation time. Since the required time for the sacrificial oxide film formation is very short, the inner surface of the trench 13 in the silicon substrate 10 can be prevented from being further oxidized. In accordance with the earlier technique, the sacrificial oxide film formation expands the STI film to cause the stresses on the PN junctions, as shown in FIG. 11. On the other hand, the sacrificial oxide film formation according to the present embodiment can prevent the expansion of the STI film so that the junction leakage current due to the stress of the expansion can be avoided, too.

Figure 8:
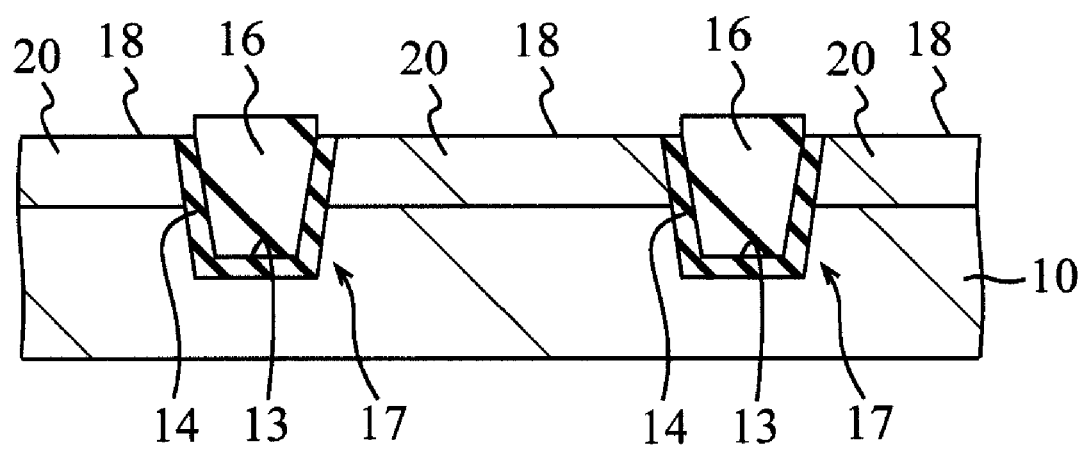
FIG. 8 is a cross-sectional view showing a subsequent process to that of FIG. 6.

Referring to FIG. 8, impurities are injected or implanted into the device formation regions 18 through the sacrificial oxide films 19 to form impurity diffusion regions 20 within the device formation regions 18. Thereafter, the sacrificial oxide films 19 are removed therefrom by using the hydrofluoric acid solution. According to the removal of the sacrificial oxide films 19, the undesirable nitride regions 15 are also removed from the silicon substrate 10.

Figure 9:
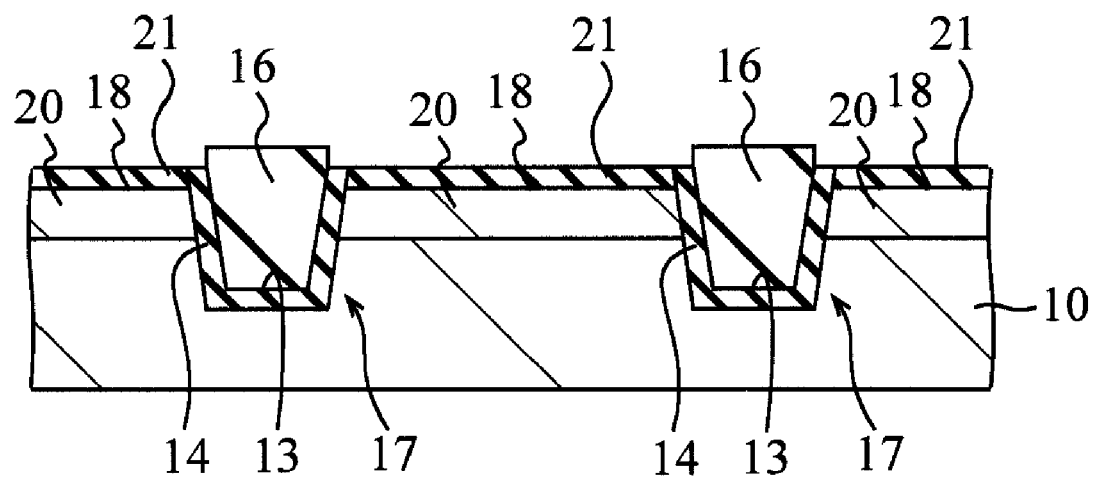
FIG. 9 is a cross-sectional view showing a subsequent process to that of FIG. 8.

Referring to FIG. 9, gate oxide films 21 are formed on the device formation regions 18. Then, devices or elements are formed in a manner well known.

For evaluation of the effect of the present embodiment, two samples were fabricated and measured, wherein one of the samples was formed in accordance with the earlier technique, while the other was formed in accordance with the present embodiment. Each of the samples had a structure similar to that of FIG. 11. In detail, each sample had a p-type silicon substrate, in which an STI film was formed to define a device formation region. In the device formation region on the surface of the silicon substrate, an n-type diffusion layer is formed to constitute a PN junction. Each of the samples had a shape of 100 nm square, as seen from above. In addition, an electrode was formed on the device formation region. The junction leakage current was measured with a predetermined voltage applied between the electrode and the substrate. The measurement result is shown in FIG. 10.

Figure 10:
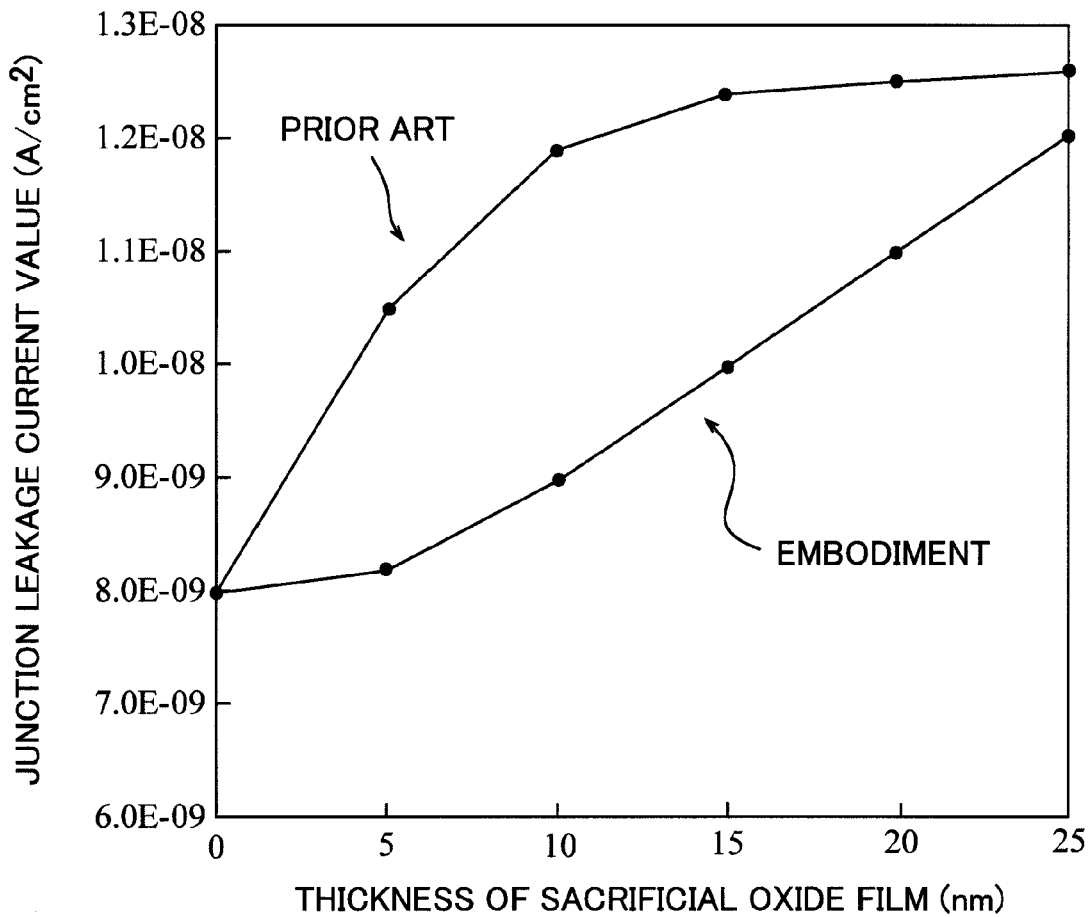
FIG. 10 is a graph showing a relationship between a thickness of a sacrificial oxide film and a junction leakage current.

As apparent from FIG. 10, if the thickness of the sacrificial oxide film is 10 nm, the junction leakage current of the conventional device was $1.2 \times 10^{-8}$ A/cm$^2$ higher than the standard of $1.0 \times 10^{-8}$ A/cm$^2$, while the junction leakage current of the present invention was $9.0 \times 10^{-9}$ A/cm$^2$ lower than the standard because the STI film is prevented from being expanded during the formation process of the sacrificial oxide layer.

The present application is based on Japanese patent applications of JP2006-319728 filed before the Japan Patent Office on Nov. 28, 2006, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method of manufacturing a semiconductor device comprising:
    under an atmosphere comprising hydrogen and oxygen, forming a sacrificial oxide film on a silicon substrate provided with at least one nitride region;
    removing the sacrificial oxide film and the nitride region from the silicon substrate.

2. The method of manufacturing a semiconductor device according to claim 1, further comprising:
    forming a trench on a silicon substrate by using a nitride film as a mask;
    forming an isolation region made of oxide materials in the trench so that the silicon substrate is provided with the nitride region.

3. The method of manufacturing a semiconductor device according to claim 1, wherein the forming a sacrificial oxide film is carried out at 800° C. or higher.

4. The method of manufacturing a semiconductor device according to claim 1, wherein the forming a sacrificial oxide film is carried out at 1000° C.

5. The method of manufacturing a semiconductor device according to claim 1, wherein the forming a sacrificial oxide film comprises forming the sacrificial oxide film on at least one device formation region of the silicon substrate.

6. A method of manufacturing a semiconductor device comprising:
   forming a trench on a silicon substrate by using a nitride film as a mask;
   forming an isolation region made of oxide materials in the trench so that the silicon substrate is provided with at least one nitride region;
   under an atmosphere comprising hydrogen and oxygen, forming a sacrificial oxide film on the silicon substrate provided with the at least one nitride region; and
   removing the sacrificial oxide film and the nitride region from the silicon substrate;
   wherein the forming an isolation region comprises:
      forming a first oxide film on the trench by wet oxidation to obtain an oxide trench; and
      filling the oxide trench with a second oxide film to form the isolation region.

7. The method of manufacturing a semiconductor device according to claim 6, wherein the forming a sacrificial oxide layer is carried out so that the sacrificial oxide film has a thickness substantially equal to three-fifth of another thickness of the first oxide film.

8. The method of manufacturing a semiconductor device according to claim 6, wherein the forming a sacrificial oxide film comprising adjusting a thickness of the sacrificial oxide film so that the thickness of the sacrificial oxide film is proportional to the thickness of the first oxide film.

9. A method of manufacturing a semiconductor device, comprising:
   forming a pad silicon oxide film on a silicon substrate;
   forming a silicon nitride film on the pad silicon oxide film;
   patterning a part of the pad silicon oxide film and the silicon nitride film to expose a first surface region of the silicon substrate;
   selectively etching the silicon substrate using the silicon nitride film as a mask to form a trench;
   forming a liner silicon oxide film on a surface of the trench;
   forming a filling insulation film, with which the trench is filled, on the liner silicon oxide film;
   removing the silicon nitride film and the pad silicon oxide film to expose a second surface region of the silicon substrate;
   covering the second surface region of the silicon substrate with a sacrificial oxide film by heat oxidation under an atmosphere comprising hydrogen and oxygen;
   removing the sacrificial oxide film to a newly exposed surface which corresponds to the second surface region of the silicon substrate; and
   forming a gate insulation film on the newly-exposed surface.

10. The method of manufacturing a semiconductor device according to claim 9, wherein the atmosphere contains O atomic radicals and OH⁻ molecular radicals.

11. The method of manufacturing a semiconductor device according to claim 9, wherein the thickness of the sacrificial oxide film is three-fifths of the thickness of the liner oxide film.

12. The method of manufacturing a semiconductor device according to claim 9, wherein the thickness of the sacrificial oxide film is adjusted so that it is proportional to the thickness of the liner oxide film.

13. The method of manufacturing a semiconductor device according to claim 10, wherein the temperature of the atmosphere is 800° C. or higher.

* * * * *